United States Patent [19]

Pascoe et al.

[11] 4,194,245
[45] Mar. 18, 1980

[54] SYSTEM FOR RANDOMLY ACCESSING A RECIRCULATING MEMORY

[75] Inventors: Robert A. Pascoe, Round Rock; Charles N. Sprott, Austin, both of Tex.; Douglas W. Westcott, Wappingers Falls, N.Y.

[73] Assignee: International Business Machines Corporation, Armonk, N.Y.

[21] Appl. No.: 883,442

[22] Filed: Mar. 6, 1978

[51] Int. Cl.² ............................................. G11C 19/00
[52] U.S. Cl. ................................................. 364/900
[58] Field of Search ... 364/200 MS File, 900 MS File; 235/92 SH

[56] References Cited

U.S. PATENT DOCUMENTS

| 3,675,216 | 7/1972 | James | 364/200 |
|---|---|---|---|
| 3,789,366 | 1/1974 | Itoh | 364/900 |
| 3,911,407 | 10/1975 | Greek, Jr. et al. | 364/900 |
| 3,958,224 | 5/1976 | Boyd et al. | 364/900 |
| 4,078,258 | 3/1978 | Lindsey et al. | 364/900 |

Primary Examiner—Gareth D. Shaw
Assistant Examiner—David Y. Eng
Attorney, Agent, or Firm—John W. Henderson, Jr.

[57] ABSTRACT

A control system for randomly accessing the contents of a recirculating shift register memory under the control of a processor. The processor provides to the control system an address equivalent to the number of positions the operating point (defined by an operating flag) is to be moved in the shift register memory to access the information desired by the processor. The control system decodes the address, removes the operating flag from the memory character stream and reinserts the operating flag in the memory at the point desired by the processor during a single revolution of the memory.

4 Claims, 3 Drawing Figures

SYSTEM FOR RANDOMLY ACCESSING A RECIRCULATING MEMORY

BACKGROUND OF THE INVENTION

1. Field of the Invention

This invention relates to shift register control in general and more particularly to a control system for dynamic recirculating shift register memories which permits random access to the contents of the shift register.

2. Description of the Prior Art (Prior Art Statement)

The dynamic recirculating shift register memory was introduced as a viable memory device for word processing systems in U.S. Pat. No. 3,675,216, issued to Randell L. James. The James invention included a self-clocked recirculating shift register which was accessed through the detection of a flag code as the flag code passed the output window of the shift register. The flag code, therefore, was used to define the operating point in the shift register and data was accessed from the shift register at a rate of one character per revolution as the flag passed the output window of the shift register.

In order to change the operating point to some other location in the shift register it is necessary to move the flag to the desired location. When the operating point was changed in the prior art shift register based text processing system, the operation point or flag was moved one position per shift register revolution, or it was jumped via one shift register revolution to a location defined by a decode of the memory contents, for example, a line end or paragraph boundary code stored in the memory. The operation for relocating the operating point to a paragraph boundary is taught in U.S. Pat. No. 3,911,407 issued Oct. 7, 1975 to John Charlie Greek, et al and entitled "Text Processing System." In the Greek, et al, patent at column 13, lines 43–67 and column 14, lines 1–9 the operation flag is advanced in the shift register memory to a paragraph boundary by removing the flag from the data stream and holding it until double carrier return codes are decoded indicating the end of a paragraph. The operation flag is then reinserted into the memory stream.

Text processing operations which required the movement of the operation flag to a point not sufficiently defined by memory content were time consuming since the flag could only be moved one position per memory revolution. This time consumption becomes intolerable in a processor based system where many milliseconds of time can be lost while the processor waits for the flag to be advanced to a new operating point. An alternative solution to the problem of changing the operating point in a recirculating shift register memory has combined movement of the flag based on memory content decode with single moves in order to arrive at the desired memory location. But this solution requires the use of a complex algorithm and can still consume excess amounts of valuable time depending on the number of single moves that must be made to arrive at the desired location in memory.

BRIEF DESCRIPTION OF THE INVENTION

The present invention allows unlimited repositioning of the shift register operation flag on one shift register revolution. Thus increasing the speed of memory access and decreasing the complexity of performing the operation.

Briefly, there is provided a shift register control technique which allows the operating point to be advanced to any location in a recirculating dynamic shift register memory during the time required for one revolution in the memory. The processor determines that access to the data stored in the shift register is required. The processor calculates the point of access as an address equivalent to the number of text characters between the current location of the operation flag and the desired location of this flag. This address is passed to the shift register control unit.

The shift register control unit stores the address and waits for the operation flag to rotate through the shift register output window. When the flag arrives, it is trapped and held while the remainder of the data flows by. Flow continues in this fashion until the number of characters which flow by while the flag is trapped is equal to the address originally sent by the processor. The operation flag is then released into the character stream at this point.

DETAILED DESCRIPTION OF THE PREFERRED EMBODIMENT

Figure 1:
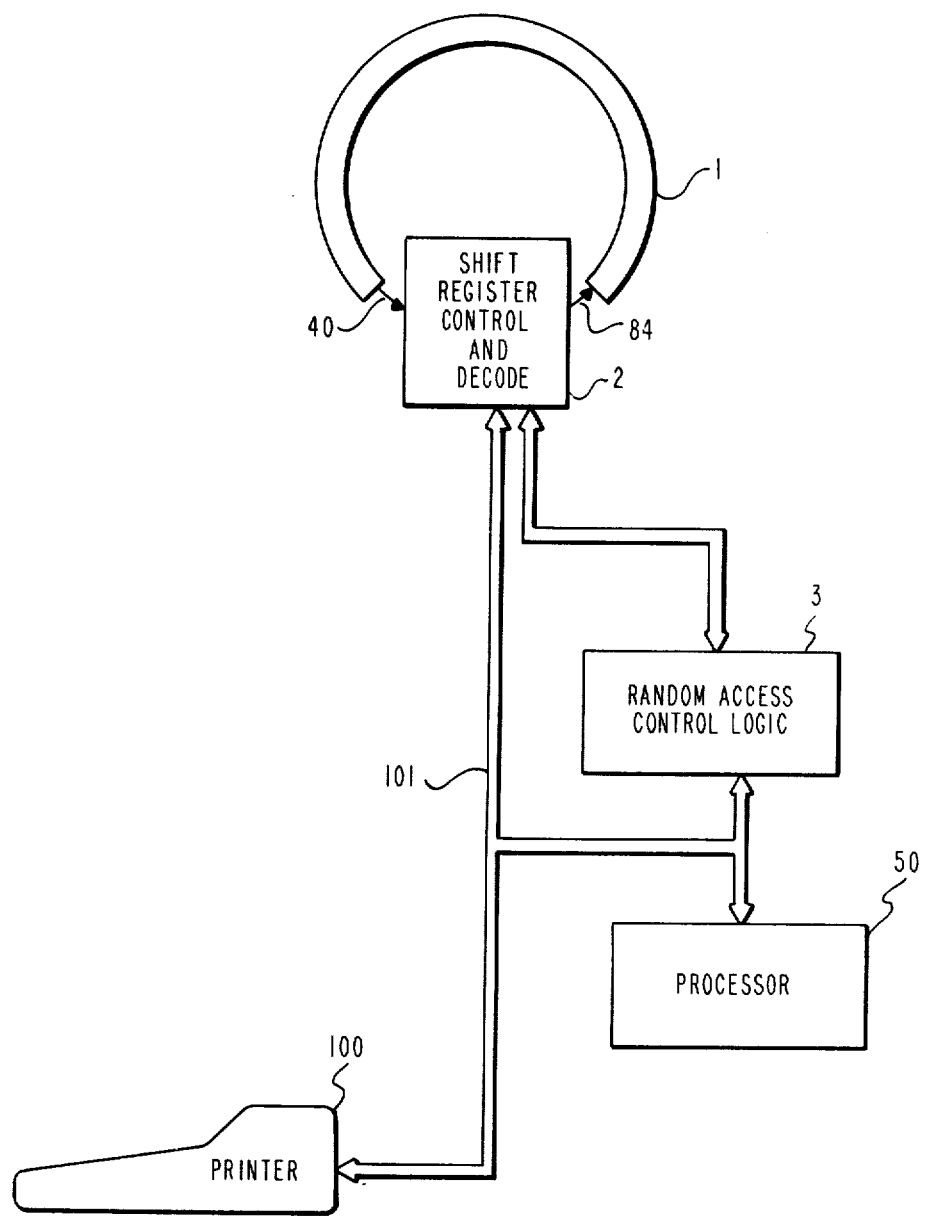
FIG. 1 shows an overall pictorial presentation of a text processing system utilizing a recirculating dynamic shift register memory.

Referring to FIG. 1, there is shown a text processing system including a processor 50 in two-way communication along cable 101 with a keyboard printer 100, or other similar input/output device, and with shift register control and decode 2. While the cable 100 is shown as a single bus, it will be understood that it includes an address bus, a data bus and an I/O select bus. The shift register control and decode may include logic of the type described in U.S. Pat. No. 3,675,216 issued July 4, 1972 to Randell L. James and entitled "No Clock Shift Register and Control Technique." The random access logic 3 of the present invention is shown connected between the processor 50 and shift register control and decode 2.

Figure 2:
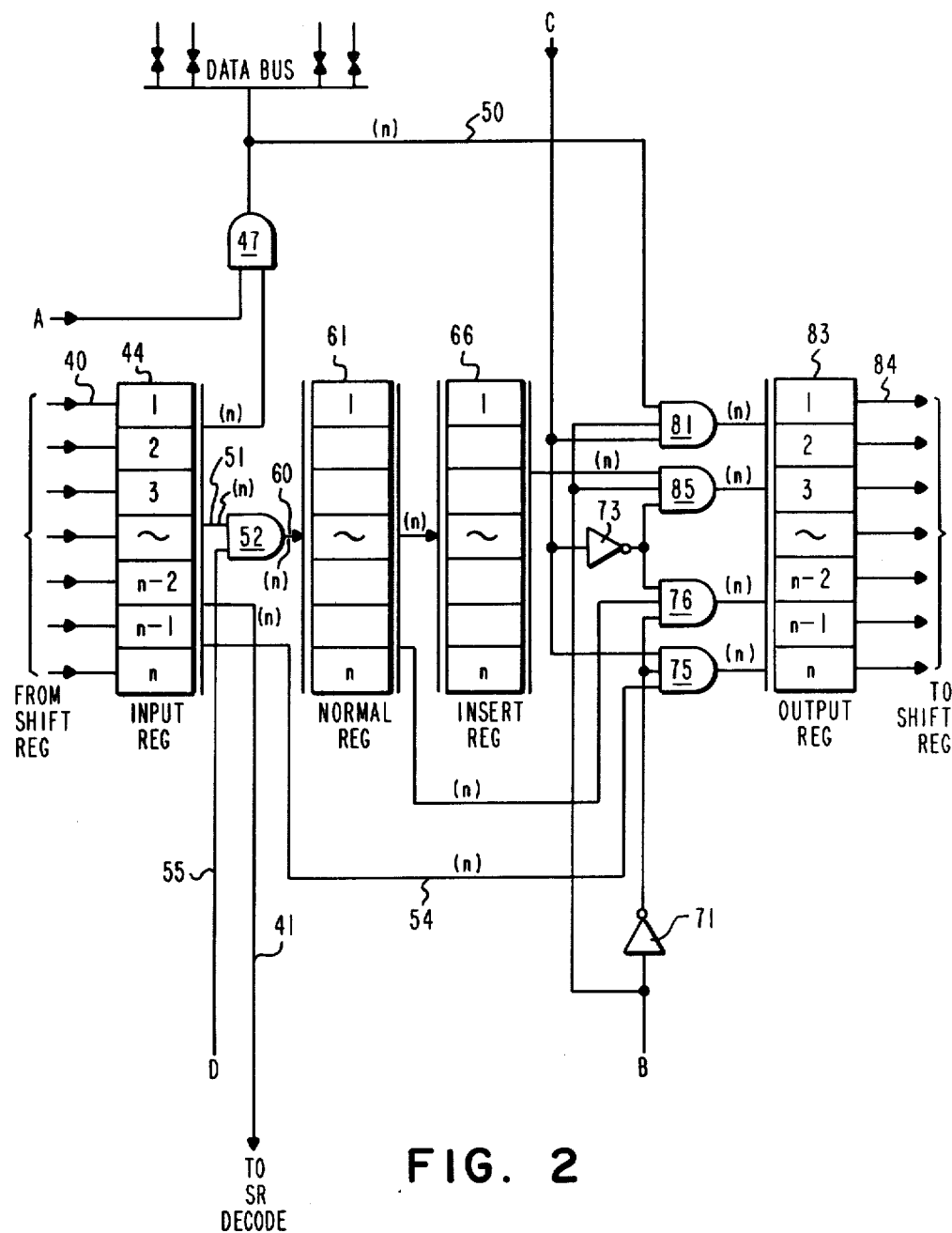
FIG. 2 depicts the recirculating dynamic shift register memory window and its associated input/output logic.

Referring now to FIG. 2 a more detailed drawing of the shift register control and decode 2 is shown. The circuitry of FIG. 2 is essentially the same as FIG. 4 of the James patent and is described in detail therein at column 4, lines 1–75 and column 5, lines 1–17. The control signals A, B, C and D control the flow of data from the shift register memory 1 through the shift register control 2 and back into the shift register memory 1. The control signals A, B, C and D also control the path taken by data being accessed from the shift register memory, inserted into the shift register memory or deleted from the shift register memory. The detailed manipulation of the control signals to perform the various operations is given in the above referenced James Patent. Briefly, data passes from the shift register 1 through signal lines 40 into the input register 44. From the input register 44 the data may be passed to the processor over the data bus by applying a positive control signal A to AND gate 47. The data in input register 44 is also passed to a decoder 43 (FIG. 3) along line 41 where individual signal lines are raised depending on the contents of the input register 44.

During normal operation, signal D is at a logical one level on signal line 55 to gate the contents of input register 44 over data line 51 through AND gate 52 and into normal register 61. The contents of normal register 61 are gated through AND gate 76 by logical zero signal B which is inverted by INVERTER 71 and a logical zero signal C which is inverted by INVERTER 73. The contents of the normal register are passed by the AND gate 76 into the output register 83 and back into the shift register memory 1 over data lines 84.

Data may be inserted into the shift register memory 1 from the data bus by raising the signal lines B and C to a logical one level which operates AND gate 81 to pass data from the data buss over data line 50 into the output register 83. The data present in the normal register 61 at this time will be preserved in the insert register 66 and the next character present in the input register 44 will be shifted into the normal register 61. This technique expands the capacity of the shift register by one character.

Following the insertion of the character from the data bus, signal C is dropped to a logical zero and signal B remains a logical one which, together with inversion of signal C from INVERTER 73, operates AND gate 85 to pass the contents of the insert register 66 to the output register 83. Data continues to cycle through insert register 66 in this fashion until a character that is to be deleted is recognized by decoder 43 in the input register 44. Following the next two data shifts, the signal B is dropped to a logical zero trapping the character to be deleted in the insert register 66. Signal line D remains at a logical one, passing data into the normal register from the input register 44 and the logical zero signals on signal lines B and C are inverted to operate AND gate 76 and pass the data from the normal register 61 into the output register 83. Thus the system is returned to the normal state.

To move a character from one location in the shift register memory 1 to another location, which is the object of the present invention, the shift register memory is taken out of the normal path when the character to be moved is held in the normal register 61. Control line C is then raised to a logical one and control line D is lowered to logical zero allowing those characters which follow to pass back into the shift register memory 1 along data line 54 through AND gate 75. When the correct position of the move is located, control line C is dropped and control line D is raised. This causes the character held in the normal register 61 to flow into the output register 83 through AND gate 76 while the data which was flowing along line 54 flows through AND gate 52 into normal register 61.

Figure 3:
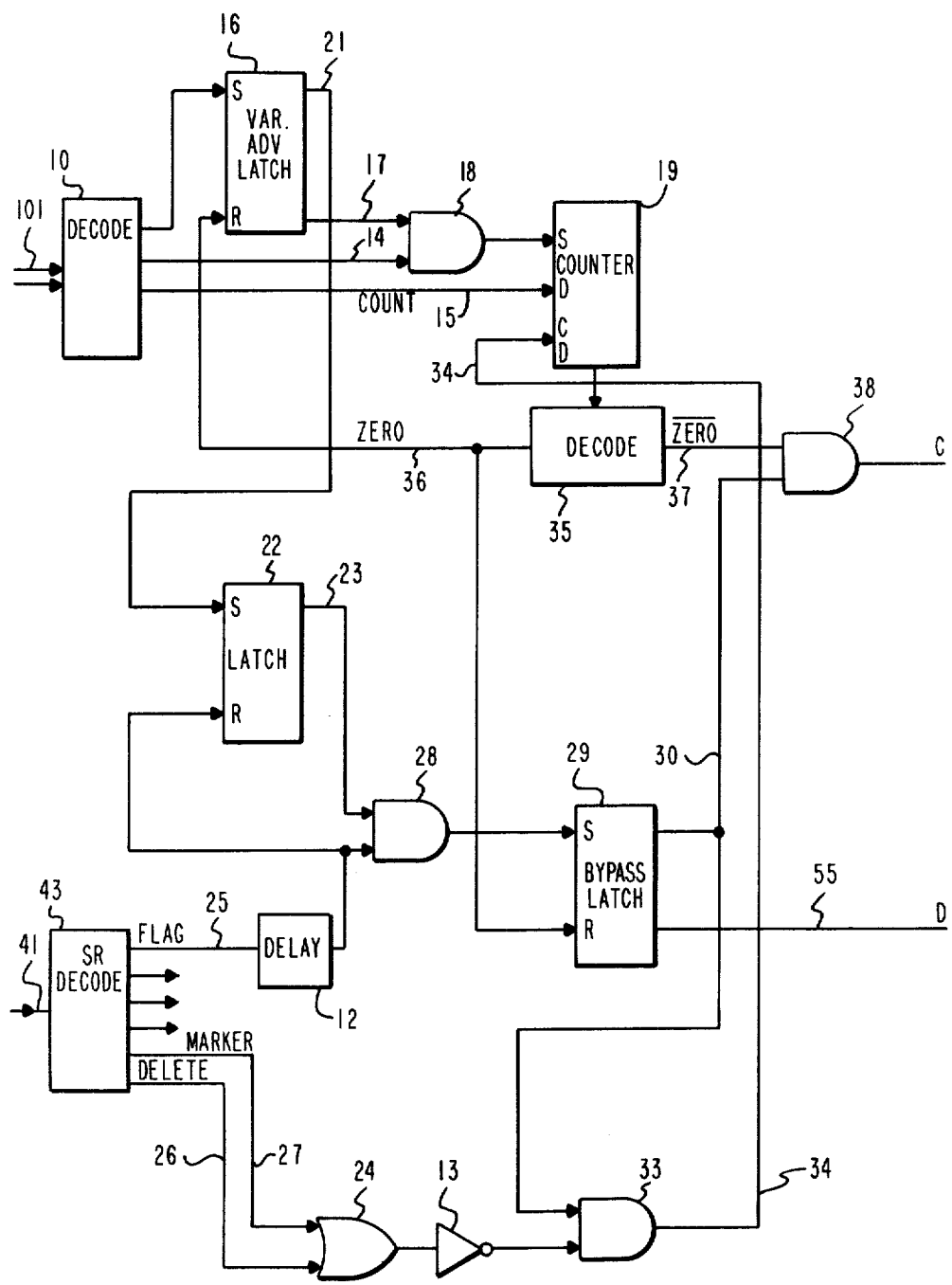
FIG. 3 shows the control circuitry for randomly relocating the operating flag in the dynamic recirculating shift register memory.

Referring now to FIG. 3, the method of controlling the control lines to relocate the operating point in the shift register memory 1 will be described. When the text processor determines that the operation flag is to be moved, it will send a LOAD ADDRESS command to the random access control logic along bus 101. The load address signal is decoded by decode 10 which generates an enable signal to AND gate 18 on line 14. At the same time, the text processor has placed the address representing the number of characters the operation flag is to be moved on the data bus portion of bus 101. This address is decoded by decode 10 to produce a count equal to the number of places the operating point is to be moved on line 15. The command to move the flag has not yet been given, so Latch 16 is off and line 17 is active. A store command is then issued through gate 18 which causes the count to be stored into the counter 19. The text processor will next issue a variable advance command to the random access control logic 3 along control portion of bus 101 to decode 10 which will set latch 16 and line 21 is activated. At the same time line 17 is deactivated. This prevents the accidental changing of the counter value while an operation flag move is being made. Line 21 active conditions latch 22 causing line 23 to go active. The contents of the shift register are viewed along line 41 by SR decode circuit 43. This circuit will determine what character is in input register 44, and raise an output line accordingly. Signals such as Flag on line 25, Delete on line 26, and Marker on line 27 are generated from the decode circuit 43.

When the flag is detected by the decode circuit, line 25 is raised. After a delay 12 equal to one shift of the shift register memory 1, a signal is presented to AND gate 28 and latch 22. This activates AND gate 28 and causes the bypass latch 29 to set. Setting bypass latch 29 causes line 30 to activate and line 55 to deactivate. Deactivating line 55 causes the D control signal on line 55 to drop to logical zero. Dropping control signal D to logical zero inhibits data from passing from the input register 44 into the normal register 61 through AND gate 52 and preserves the flag in normal register 61. The signal on line 30 is presented to AND gate 33. Assuming that the decoder has not recognized either a Delete code 26 or a Marker code 27, the count down signal is raised along line 34 to the counter 19. The output of the counter is decoded at decode circuit 35. This decoder will recognize when the counter has gone to zero and activate line 36. Line 37 will be active at all other times. With line 30 activated as described above, and line 37 active since a value has been loaded into the counter, gate 38 is made and control signal C is raised. With the shift register control lines in this mode, the flag is trapped in Normal register 61 and the remainder of the characters are passed back to the shift register memory along line 54 through gate 75. For each character passed in this fashion, the value stored in counter 19 is decreased by one. The count down process will be temporarily interrupted when a Delete code or Marker code is decoded by 43. These two codes are internal controls to the shift register and their location is not known to the text processor. Therefore they are not accounted for in the count value stored in 19. A circuit comprising OR gate 24 and INVERTER 13 is therefore provided which causes the count down process to be suspended when these codes are encountered. When Delete 26 or Marker 27 occur, gate 33 is deactivated by OR gate 24 and INVERTER 13 causing countdown to stop. When these lines drop, gate 33 reactivates and the countdown continues.

When the counter goes to zero, line 36 activates causing latches 16 and 29 to reset. This in turn causes the latch signal on line 55 to activate and gate 38 to deactivate, that is control signal D is activated and control signal C is dropped. This returns the shift register to the normal path and the operation flag stored in normal register 61 re-enters the shift register memory 1 through AND gate 76 on the next data shift. The move is now complete.

It will be well understood by those skilled in the art that the technique herein described for advancing the operating point in a recirculating dynamic shift register by variable amounts not dependent on the content of the memory can be applied to relocating other codes in the memory as well as the operating flag.

While the invention has been particularly shown and described with reference to a particular embodiment, it will be understood by those skilled in the art that various changes in form and detail may be made without departing from the spirit and scope of the invention.

What is claimed is:

1. A memory control system for randomly relocating the accessible operating flag in a recirculating memory in one revolution of the memory comprising:
   code means in said recirculating memory for defining the accessible operating flag in said memory;
   means for receiving an address to be accessed in said memory;
   means for decoding said address into a count representing the number of memory locations the code means is to be moved from its present location to the address to be accessed;
   means for detecting said code means;
   means for generating a control signal for removing said code means from recirculating in said recirculating memory in response to said means for detecting;
   means for counting the number of codes recirculating in said memory while said code means is removed in response to said means for decoding; and
   means for reinserting the code means in said recirculating memory at the address to be accessed when the means for counting has counted a number of codes equal to the count established by said means for decoding.

2. A memory control for relocating a flag code stored in a recirculating memory to any address in said recirculating memory comprising:
   control means for accessing the flag codes stored in said memory;
   means for detecting said flag code to be relocated;
   means for receiving an address to which said flag code is to be relocated;
   means for decoding said address into the number of memory locations the flag code is to be relocated;
   means for establishing a count in a counter equal to the number of memory locations the flag code is to be relocated;
   means in said control means for removing said flag code to be relocated from the data stream of said recirculating memory;
   means for decrementing said counter by one for each code that recirculates through said control means while the flag code to be relocated is removed from the data stream; and
   means in said control means for reinserting said flag code to be relocated into the data stream when the count in said counter equals zero.

3. The memory control of claim 2 wherein said means for decrementing said counter further includes means for detecting internal control codes to the recirculating memory and means responsive to the detection of said internal control codes for suspending decrementing said counter.

4. A method for randomly relocating the accessible operating point in a recirculating memory comprising the steps of:
   defining the accessible operating point in said memory;
   receiving an address to which said operating flag is to be relocated in said recirculating memory;
   decoding said address into a count representing the number of memory locations the accessible operating flag is to be moved from its present location;
   detecting the accessible operating flag in said memory;
   removing the accessible operating flag from recirculating in said recirculating memory;
   counting codes recirculating in said memory while the accessible operating flag is removed; and
   reinserting the accessible operating flag at the address to be accessed when the number of counted codes equal the decoded address.

* * * * *